(12) United States Patent
Putzeys

(10) Patent No.: US 6,803,816 B2
(45) Date of Patent: Oct. 12, 2004

(54) SWITCHING POWER AMPLIFIER

(75) Inventor: Bruno Johan Georges Putzeys, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/955,896

(22) Filed: Sep. 19, 2001

(65) Prior Publication Data

US 2002/0053945 A1 May 9, 2002

(30) Foreign Application Priority Data

Sep. 21, 2000 (EP) ............................................. 00203269

(51) Int. Cl.[7] ........................... H03F 3/38; H03F 3/217; H03K 9/08; H03K 7/04
(52) U.S. Cl. ..................... 330/10; 330/207 A; 330/251; 375/238; 375/239
(58) Field of Search .............................. 330/10, 207 A, 330/251; 375/238, 239

(56) References Cited

U.S. PATENT DOCUMENTS

| | | | | | |
|---|---|---|---|---|---|
| 4,614,901 A | * | 9/1986 | Kullman et al. | ............... | 307/28 |
| 5,099,203 A | * | 3/1992 | Weaver et al. | ................ | 330/10 |
| 5,339,041 A | * | 8/1994 | Nitardy | ....................... | 330/10 |
| 5,734,565 A | * | 3/1998 | Mueller et al. | ............. | 363/132 |
| 5,930,132 A | * | 7/1999 | Watanabe et al. | ............. | 363/41 |

FOREIGN PATENT DOCUMENTS

EP    0930700 A2    7/1999    ........... H03F/3/217

\* cited by examiner

Primary Examiner—Patricia T. Nguyen
(74) Attorney, Agent, or Firm—Jack D. Slobod

(57) ABSTRACT

Switching power amplifiers are used for example in audio applications. Using Class D technology is used to obtain efficient performance. To improve the switching power amplifier further it is proposed to combine a plurality of low-power switching power stages into a larger amplifier. The precision and efficiency of a switching power amplifier is improved without deteriorating the noise and EMI.

8 Claims, 3 Drawing Sheets

SWITCHING POWER AMPLIFIER

BACKGROUND OF THE INVENTION

1. Field of the Invention

The invention relates to a switching power amplifier for supplying an audio output signal.

2. Description of the Related Art

From the European patent application EP-A-0930700, a known class D amplifier receives at an input a PCM input signal. Using traditional class D technology any of three imperfections, that is efficiency, linearity or EMI, may be improved upon with the expense of at least one of the other two. The switching frequency is directly proportional to the required signal bandwidth. Further the high repetition rate of for example DSD (Direct Stream Digital) will translate into a vary high switching noise and thus low efficiency. A DSD signal is a representation of an audio signal using the following parameters. Sampling rate=64 or 48 times 44.1 kHz. One bit, noise shaped. Maximum modulation index= 50%. Using bandwidth 60 kHz, spectral information up to 100 kHz.

SUMMARY OF THE INVENTION

It is an object of the invention to improve the known switching power amplifier.

To this end a switching power amplifier according to the invention comprises an input unit for receiving an input signal, a plurality of parallel low power switching power stages for outputting a plurality of output signals, a driving unit to drive the power stages in response to the input unit receiving the input signal, and a summation unit for summing the output signals of the power stages. The precision and efficiency of a switching power amplifier is improved by combining a plurality of low-power switching power stages into a larger amplifier. In this way it is made possible to increase the efficiency of the switching power amplifier without deteriorating the other imperfections.

The advantages of multiple phases are: output switches will need to supply only a fraction of the total power, the switches are smaller and hence switch faster, with less losses, the number of output transitions is distributed across these smaller switches, and the influence of a timing error on one switch will be 1/n of what it would have been with a single phase.

A specific drive method is used to allow for low-loss combination of the signal voltages. An inductive combiner is devised to provide error-free combination. This method allows for direct conversion of for example DSD signals into analog power with low distortion and high efficiency.

BRIEF DESCRIPTION OF THE DRAWINGS

The invention and additional features, which may optionally be used to implement the invention to advantage will be apparent from and elucidated with reference to the examples as described here below and hereinafter and shown in the figures. Herein shows.

DETAILED DESCRIPTION OF THE PRESENTLY PREFERRED EMBODIMENTS

Figure 1:
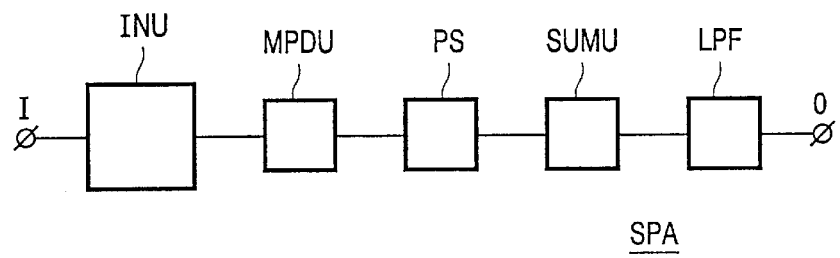
FIG. 1 block-schematically a switching power amplifier according to the invention, FIG. 2 a block-schematically switching power amplifier according to the invention in more detail with a DSD input signal, FIG. 3 a block-schematically example of a switching power amplifier according to the invention with a PCM input signal, FIG. 4 block-schematically an analog implementation of a switching power amplifier, FIG. 5 an example of an inductor summation means.

FIG. 1 shows block-schematically an example of a switching power amplifier SPA. At an input I, the switching power amplifier receives an input signal. The input I is coupled to an input unit INU for converting the input signal into a signal which can be used in the multiphase drive unit MPDU. The output of the multiphase drive unit is coupled to the power stage PS. The output of the power stage is coupled to a summation unit SUMU. The output of the summation unit is coupled via a low pass filter to the output 0 of the switched power amplifier.

The advantages of multiple phases are: output switches will need to supply only a fraction of the total power, the switches are smaller and hence switch faster, with less losses, the number of output transitions is distributed across these smaller switches, and the influence of a timing error on one switch will be 1/n of what it would have been with a single phase.

Figure 2:
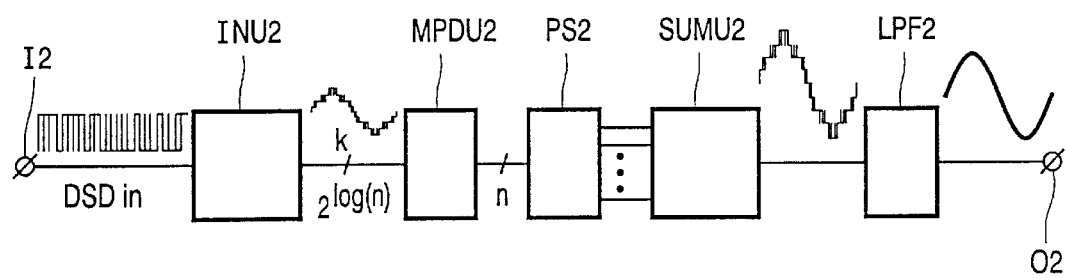

FIG. 2 shows an example of a switching power amplifier SPA2 that receives at an input I2 a DSD signal. The input I2 is coupled via the input unit INU2 to the multiphase drive unit MPDU2. Also in this example, the multiphase drive unit is coupled to the power stage PS2. And the output of the power stage is coupled to the summation unit SUMU2. The output of the summation unit is coupled via a low pass filter LPF2 to the output O2 of the switching power amplifier.

The input unit INU2 filters in this example the input DSD signal, and supplies k signals to the multi phase drive unit MPDU2. The multi phase drive unit supplies n drive signals to the power stage PS2 that is in this example an n-phase power stage. The output of the power stage is coupled to a summation unit for summing the n different output signals. The output of the summing unit is coupled via the low pass filter LPF2, for example an LC low pass filter to the output O2 of the switching power amplifier SPA2.

This method of producing gain allows the DSD signal to modulate the amplifier fully, even if its modulation level is too low.

Figure 3:
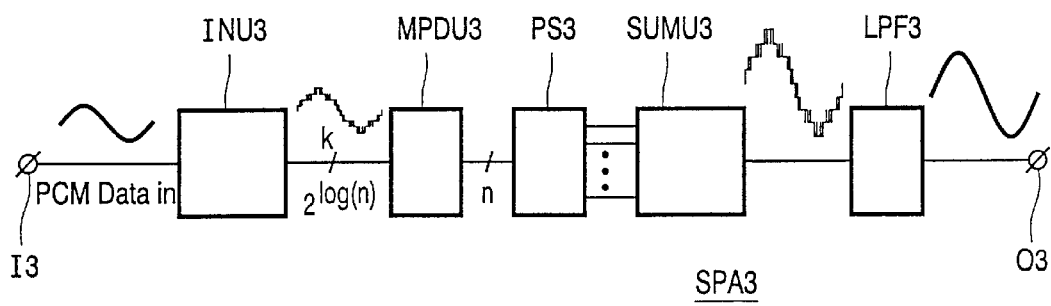

FIG. 3 shows another example of a switching power amplifier SPA3 according to the invention. In this example, the input I3 receives a PCM signal which input is coupled to the input unit INU3. Also in this example, the input unit INU3 is coupled to the multiphase drive unit MPDU3, which is coupled to the power stage PS3. The output of the power stage is coupled to the summation unit SUMU3. Which summation unit is coupled via a low pass filter LPF3 to the output O3 of the switching power amplifier. In this example, instead of a DSD input signal a PCM input signal is used. The input unit INU3 comprises in this example an upsamples and a noise shaper to supply to the multi phase drive unit MPDU3 k signals.

Figure 4:
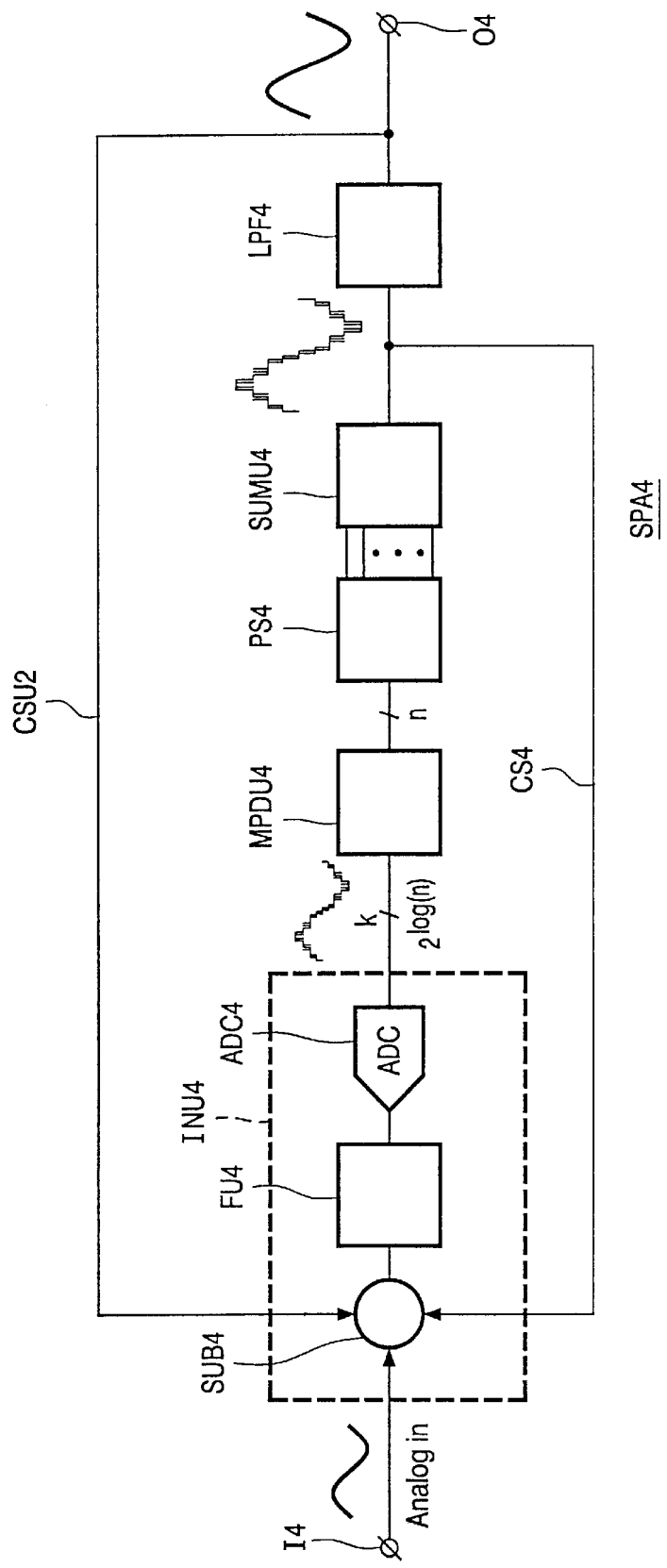

FIG. 4 shows an example of a switching power amplifier SPA4 as an analog amplifier. In this example, the input I4 receives an analog input signal and is coupled to the input unit INU4. In this example, the input unit comprises a subtractor SUB4 for subtracting a control signal cs4 from the input signal. It is possible to add a second control signal CSU2 for example to the output O4. The output of the subtractor is coupled via a filtering unit FU4 and an AD converter unit ADC4 to the multiphase drive unit MPDU4. The output of the multiphase drive unit is also in this example coupled to the power stage PS4. The output of the power stage is coupled to the summation unit SUMU4. The output of the summation unit is coupled via a low pass filter LPF4 to the output of the switching power amplifier.

In this example, the switching power amplifier SPA4 receives an analogue input signal. When the emphasis is on economy rather than on the ability to process digital audio directly, the advantages of multiphase operation are still significant enough to warrant application in an analog environment. This in done by an analogue control loop, such as used in oversampling low-bit ADC converters, its output feeding into the flash ADC having as many quanta as does the power stage. The output from the ADC may then be processed as outlined before.

The input of the control loop is the difference found between the input and the output after the summation unit SUMU4. Extra feedback signals may also be taken off at several points on the output filter, including the output.

Figure 5:
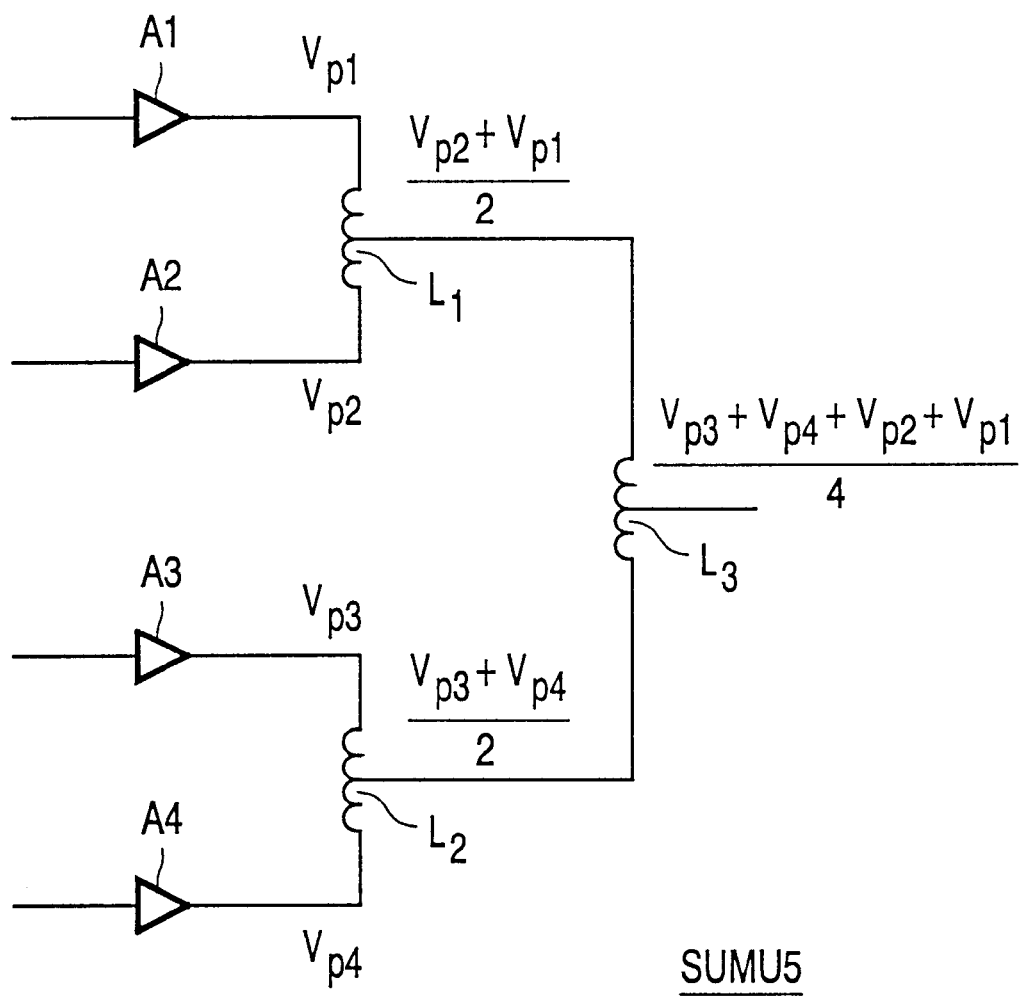

FIG. 5 shows an example of a summation unit SUMU5, having a way of summing (averaging, actually) signals with high precision is to use the autotransformer. The precision of the summation is not influenced by the nature of the core. The signals are supplied via amplifiers A1–A4 to the coils L1 and L2. The coils L1 and L2 are coupled to the output coil L3. It will be noticed that another doubling of the number of phases by adding one level of summation. This method has as one of the great advantages a very high precision of summing where the summing network is separate from the output filter and the output current produces no magnetization of the cores. The ripple current can be made small. And the size of the coils is independent of the amount of power to be delivered. Further adding the signals in this way the tolerances of the inductors can be neglected.

Above the invention has been described on the basis of some examples. The man skilled in the art will be well aware of a lot of variations falling within the scope of the invention.

What is claimed is:

1. A switching power amplifier, comprising:
   an input unit for receiving an input signal;
   a plurality of parallel low power switching power stages outputting a plurality of output signals;
   a driving unit for driving the plurality of parallel low power switching stages in response to said input unit receiving the input signal; and
   a summation unit for summing the plurality of output signals outputted by said plurality of parallel low power stages.

2. The switching power amplifier of claim 1, wherein said driving unit is a multiphase driving unit.

3. The switching power amplifier of claim 1, wherein said plurality of parallel low power switching power stages constitute an N-phase power stage.

4. The switching power amplifier of claim 1, wherein said summation unit is an inductor summation unit.

5. The switching power amplifier of claim 1, wherein said input unit includes a FIR filter, and
   wherein the input signal is a DSD signal.

6. The switching power amplifier of claim 1, wherein said input unit includes an upsampler and a noise shaper, and wherein the input signal is a PCM signal.

7. The switching power amplifier of claim 1, wherein said input unit includes a filter unit and an AD converter, and wherein the input signal is an analog signal.

8. A method of operating a switched power amplifier, said method comprising:
   receiving an input signal;
   driving a plurality of parallel low power switching power stages in response to receiving the input signal; and
   summing a plurality of output signals of the plurality of parallel low power stages.

* * * * *